(12) United States Patent
Zhao et al.

(10) Patent No.: US 7,884,334 B2
(45) Date of Patent: Feb. 8, 2011

(54) CHARGED PARTICLE BEAM IMAGING METHOD AND SYSTEM THEREOF

(75) Inventors: Yan Zhao, San Jose, CA (US); Jack Jau, Los Altos Hills, CA (US)

(73) Assignee: Hermes Microvision, Inc., Hsinchu (TW)

( * ) Notice: Subject to any disclaimer, the term of this patent is extended or adjusted under 35 U.S.C. 154(b) by 199 days.

(21) Appl. No.: 12/357,969

(22) Filed: Jan. 22, 2009

(65) Prior Publication Data
US 2010/0181492 A1 Jul. 22, 2010

(51) Int. Cl.
*G01K 1/08* (2006.01)
*H01J 3/14* (2006.01)
*H01J 3/26* (2006.01)

(52) U.S. Cl. .................. 250/398; 250/306; 250/307; 250/309; 250/310; 250/311; 250/396 R; 250/397; 250/423 R; 250/424

(58) Field of Classification Search .............. 250/398, 250/396 R, 306, 307, 309–311, 397, 423 R, 250/424
See application file for complete search history.

(56) References Cited

U.S. PATENT DOCUMENTS 6,828,571 B1 * 12/2004 McCord et al. .......... 250/492.2
7,232,997 B2 * 6/2007 Edinger et al. .............. 250/311
7,335,879 B2 * 2/2008 Chen ........................ 250/310

\* cited by examiner

*Primary Examiner*—Jack I Berman
*Assistant Examiner*—Meenakshi S Sahu
(74) *Attorney, Agent, or Firm*—Muncy, Geissler, Olds & Lowe, PLLC

(57) ABSTRACT

The method includes scanning a sample in at least one first scan line using a first charged particle beam probe; scanning the sample in at least one second scan line using a second charged particle beam probe, and scanning the sample in at least one third scan line using the first charged particle beam probe. The first or second charged particle beam probe is defocused by a control module of the imaging system through adjusting a condenser lens module, an objective lens module, a sample stage of the imaging system, or their combination. An image of the sample is selectively formed from the first, second and third scan lines. The first and the second charged particle beams induce a first charging condition and a second charging condition on the sample surface respectively. The second charging condition can enhance, mitigate, eliminate, reverse or have no effect on the first charging condition.

23 Claims, 4 Drawing Sheets

CHARGED PARTICLE BEAM IMAGING METHOD AND SYSTEM THEREOF

FIELD OF THE INVENTION

This invention relates to an imaging method and system, and more particularly to an imaging method and system which defocuses a charged particle beam probe to regulate the sample surface charging during charged particle beam imaging.

BACKGROUND OF THE INVENTION

A scanning charged particle beam imaging system uses a charged particle beam to scan the surface of a sample, collects the secondary electrons emitted from the sample to form images of the sample. The system has to focus the charged particle beam on the surface of the sample when sampling. However, the initial surface charging on the sample surface and/or variation of surface charging may alter the focus of charged particle beam probe for image sampling, or the surface charging induced by previous image sampling becomes severe enough to distort the subsequent image. As an attempt to solve these problems, pre-scan and post-scan methods have been developed for regulating the surface charging.

The pre-scan method includes regulating the surface charging and then sampling the sample, wherein the purpose of regulation of surface charging is to achieve a neutral or uniform surface charging. That improves the secondary electron image contrast.

The post-scan method includes sampling the sample and then regulating the surface charging, wherein the purpose of regulation of surface charging is to release or reduce the surface charging induced by previous image sampling to an extent where the quality of a subsequent image sampling will not be severely harmed.

One of the known approaches proposed to control the surface charging problem searches for the optimal beam condition for the imaging scan. The optimal beam condition is determined in a sense that it induces no or little surface charging at the given the characteristics of the sample to be inspected (e.g. composing materials, physical/electrical properties thereof, etc.) and the required imaging specifications. The found optimal beam condition can then be used for sampling the sample with confidence of no or tolerable surface charging in terms of distortion or uniform focus, but may not guarantee the image quality in term of image topographical contrast and voltage contrast.

Another known method makes use of an additional charged particle beam probe source, which is typically referred to as a flood gun, to scan the imaging area beforehand so as to regulate its surface charging condition thereby making it suitable for the subsequent imaging scan. For example, the flood scan may be performed on the entire wafer. The drawback of this method is that it is hard to control the surface charging uniform and hold the charging long enough for some samples to be inspected. For example, when the imaging area is large, it may take hours to finish sampling the whole imaging area. As a result, for the end portions of the imaging area, the regulated charging condition may have already changed when the imaging scan is finally made to these regions.

Accordingly, the present invention is intended to propose a method to more efficiently carry out surface charging regulation during charged particle beam imaging.

SUMMARY OF THE INVENTION

A feature of this invention is to provide a method for regulating sample surface charging, so as to improve the effectiveness of charged particle beam imaging.

Another feature of this invention is to provide a charged particle beam imaging system capable of regulating sample surface charging during charged particle beam imaging.

According to an aspect, an imaging method comprises scanning a sample surface in at least one first scan line using a first charged particle beam probe; scanning the sample surface in at least one second scan line using a second charged particle beam probe, and scanning the sample surface in at least one third scan line using the first charged particle beam probe. One of the first and second charged particle beam probe is selected to be defocused. An image of the sample is selectively formed from the first, second and third scan lines. The first charged particle beam induces a first charging condition on the sample surface; the second charged particle beam induces a second charging condition on the sample surface. The second charging conditions can enhance, mitigate, eliminate, reverse or have no effect on the first charging condition. The disclosed method can be implemented as a computer program encoded in a computer readable medium.

According to another aspect, a charged particle beam imaging system comprises a sample stage for holding a sample thereon, at least one charged particle beam source, a condenser lens module, a probe forming objective lens module, a charged particle beam deflection module, a charged particle detector, and a control module. The charged particle beam source generates a primary charged particle beam. The condenser lens module condenses the primary charged particle beam. The objective lens module focuses the condensed primary charged particle beam to form a charged particle beam probe. The formed charged particle beam probe is scanned across a surface of the sample by the charged particle beam deflection module. The charged particle detector collects the secondary charged particles excited by primary charged particle beam probe to form an image of the sample.

The control module is coupled to the condenser lens module, the objective lens module and the sample stage. The control module defocuses the charged particle beam probe by adjusting a driving current/voltage of the condenser lens module and/or the objective lens module. The defocusing of the charged particle beam probe can also be achieved by the control module through adjusting the height of the sample stage thereby altering the distance between the objective lens module and the sample surface.

DESCRIPTION OF THE EXEMPLARY EMBODIMENTS

Figure 1:
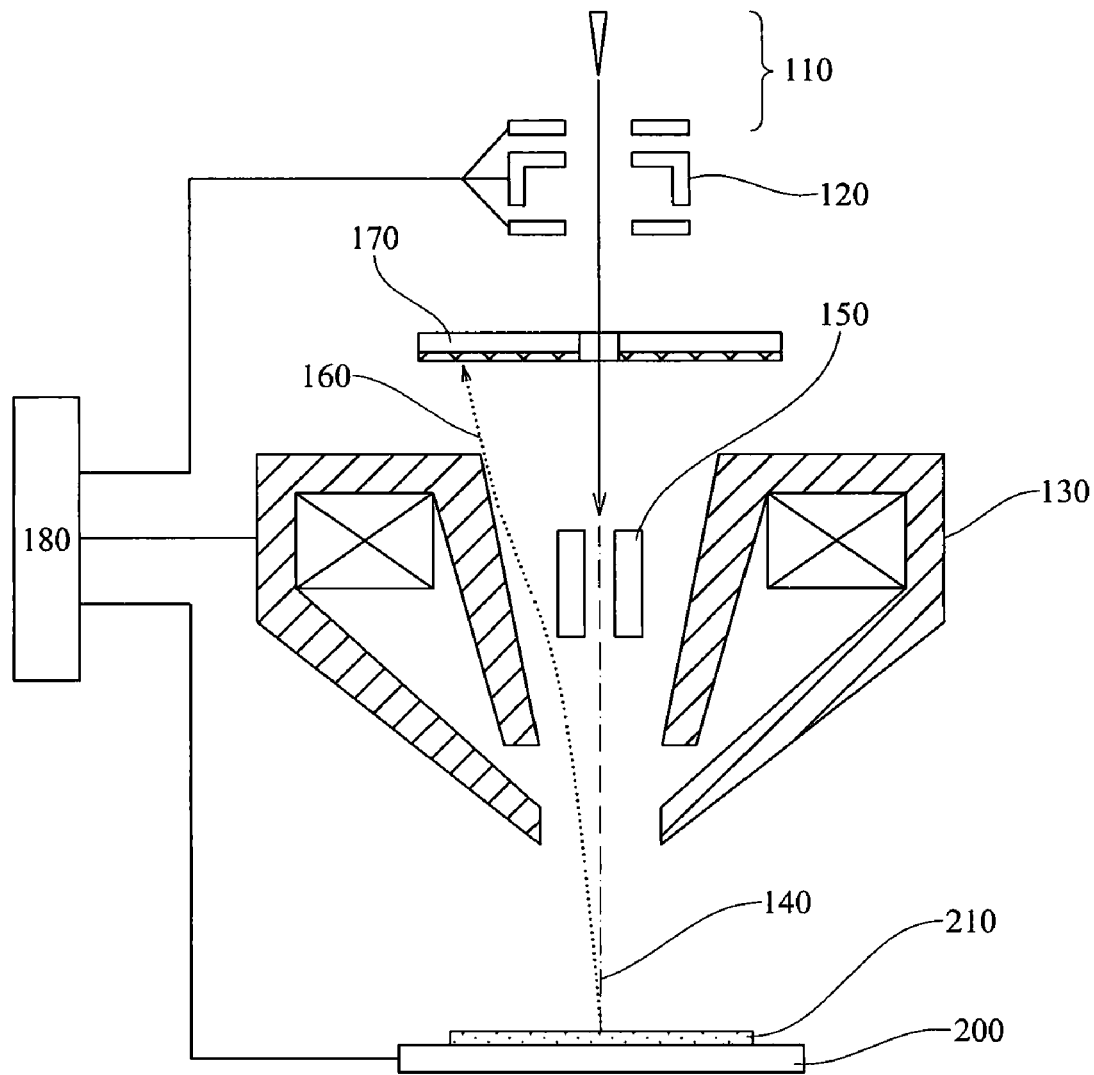
FIG. 1 is a schematic diagram illustrating an example charged particle beam imaging system according to an embodiment of this invention.

FIG. 1 is a schematic diagram illustrating a charged particle beam imaging system 100 in accordance with an embodiment of the present invention. The imaging system 100 includes a charged particle beam source which generates a primary charged particle beam. In this embodiment the charged particle beam source is a charged particle beam gun 110. Charged particles are emitted from the charged particle beam gun 110 and then accelerated by an electrical and/or magnetic field to form a primary charged particle beam. The primary charged particle beam is condensed by a condenser lens module 120 and focused by an objective lens module 130 to form a charged particle beam probe 140. The charged particle beam probe 140 can be deflected by a charged particle beam deflection module 150 to scan across the surface of a sample 210 thereby forming at least one scan line thereon. The sample 210 is placed on a sample stage 200. The sample stage 200 can move multi-dimensionally to position the sample 210. In one example, a three dimensionally-moving sample stage 210 is used. In one embodiment, the three dimensions are denoted as (X, Y, Z), where the X-Y plane overlaps with the scanning plane and the Z axis is perpendicular to the X-Y pane. Secondary charged particles 160 are emitted from the sample surface due to bombardment of the charged particle beam probe 140 on the sample 210. A detector 170 then collects the emitted secondary charged particles 160 together with back scattered primary charged particles for further processing to form an image.

In addition, a control module 180 is coupled to the condenser lens module 120, the objective lens module 130 to control operations thereof. For example, the control module 180 may be designed to control the condenser lens module 120 and the objective lens module 130 for defocusing the charged particle beam probe 140. The control module 180 may also be coupled to and thus control the sample stage 200 for defocusing the charged particle beam probe 140. Here, a charged particle beam probe is defined as being focused or defocused by its beam probe spot size. For example, if the beam spot of the charged particle beam probe 140 is set to be at an available minimum diameter given the physical design of the imaging system 100 with required imaging specifications being applied (which may fix some of the beam condition parameters), then the charged particle beam probe 140 is said to be focused. The charged particle beam probe 140 may be said to be defocused if its spot diameter exceeds a predefined factor of the available minimum spot diameter. In one example, this factor is set to be 1.5. Generally, the charged particle beam probe 140 is set to be focused when performing the imaging scan of the sample 210.

In one embodiment, the control module 180 is further coupled to the charged particle beam deflection module 150 for performing the scanning of the sample (which may also require coordination with the motion of sample stage 200 under the control of the control module 180).

The control module 180 can be implemented in pure hardware, firmware, pure software, or combination thereof. For example, the control module 180 can be implemented as an embedded computing device or as part of a larger control system of, for example, an IC manufacturing process. Or, the control module 180 may be implemented as a computer readable medium coded with a computer program which runs on a compatible computing device such as a mainframe host, terminals, personal computers, any kind of mobile computing devices or combination thereof. In one embodiment, the control module 180 is coupled to the condenser and objective lens modules 120, 130, and the sample stage 200 through a medium selected from a group consisting of the following, or any combination thereof: cable wire, optical fiber cable, portable storage media, IR, Bluetooth, intranet, internet, wireless network, wireless radio, etc.

In one embodiment, the control module 180 adjusts a driving current and/or voltage of the condenser lens module 120, the objective lens module 130, or both, to tune the electrostatic and/or magnetic fields generated by these lens modules which are for controlling the convergence of the charged particle beam probe 140. During the formation of the charged particle beam probe 140, the primary charged particle beam typically leaves the charged particle beam gun 110 divergent, then when it passes through the condenser lens module 120, it converges under the affect of the electrostatic and/or magnetic field generated by the condenser lens module 120. The condensed primary charged particle beam is then further converged and focused by the objective lens module 130 through its electrostatic/magnetic field into the charged particle beam probe 140, with a focus point thereof located on the surface of the sample 210. With a fixed setting of the two lens modules 120 and 130, the focus point of beam probe 140 should remain on the surface of sample 210.

To defocus the charged particle beam probe 140, the control module 180 adjusts the driving current and/or voltage of either or both of the two lens modules 120 and 130, changing the electrostatic/magnetic fields affecting the convergence of beam probe 140, thereby shifting the focus point of beam probe 140 away from the sample surface. For example, by increasing the driving current of the objective lens module 130, the strength of electrostatic/magnetic field generated by the condenser lens module 130 may increase thereby bringing the focus point of beam probe 140 closer to the objective lens 130. On the contrary, in another example, by increasing the driving current of the objective lens module 130 the strength of electrostatic/magnetic field generated by the condenser lens module 130 is decreased thereby bringing the focus point of beam probe 140 farther from the objective lens 130.

In one embodiment, the control module 180 adjusts the relative distance between the sample 210 and the objective lens module 130 to defocus the charged particle beam probe 140. In particular, the control module 180 adjusts the height of the sample stage 200 thereby altering the distance between the objective lens module 130 and the surface of sample 210 (also referred to as the "working distance"), so as to control the focusing condition of the charged particle beam probe 140.

Figure 2A:
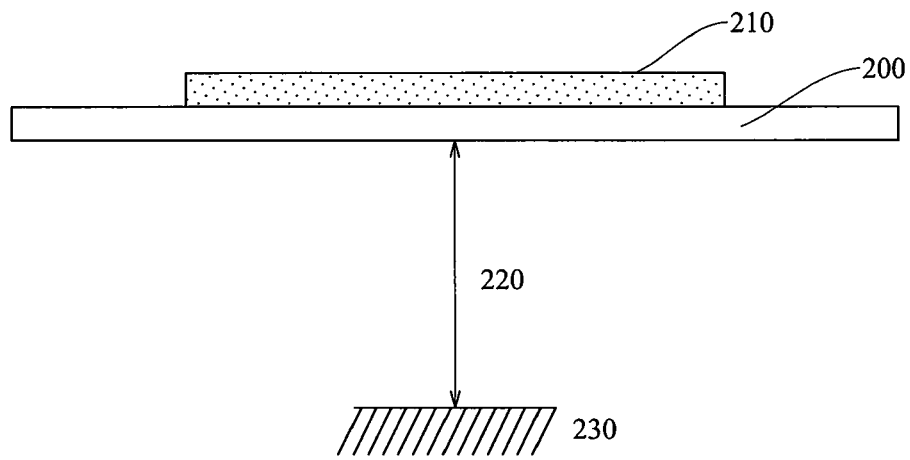
FIG. 2A is a schematic diagram illustrating an example stage height in accordance with an embodiment of the present invention.
Figure 2B:
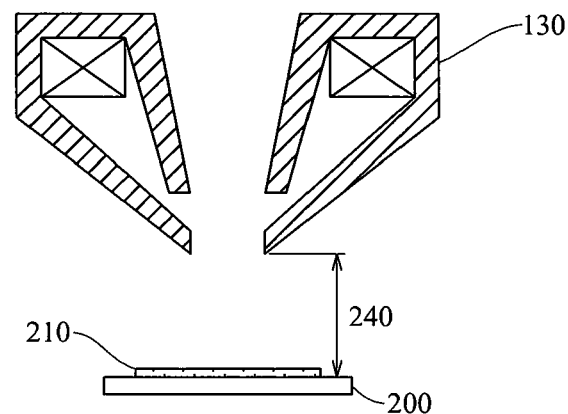
FIG. 2B is a schematic diagram illustrating an example stage height in accordance with an embodiment of the present invention.
Figure 2C:
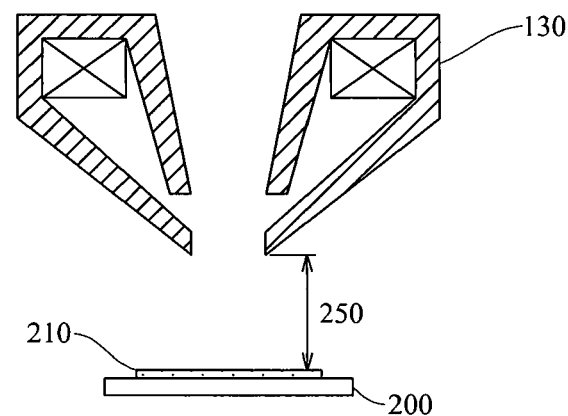
FIG. 2C is a schematic diagram illustrating a working distance in accordance with an embodiment of the present invention.

For example, assume the setting of the condenser and objective lens module 120 and 130 is fixed, causing the focus point of beam probe 140 to be fixed at a position in space, say being on the surface of the sample 210. Then, through adjusting the height of the sample stage 200 by the control module 180, the sample surface (or say the scanning plane) is caused to shift to fall spatially ahead of or behind the focus point of the beam probe 140, rendering the same defocusing effect for the beam probe 140. The height of the sample stage 200 is determined with respect to a predefined reference point. Referring to FIG. 2A, in on embodiment this reference point may be set to be on the ground. As a result, an example stage height 220 is defined as a vertical distance between the bottom surface of sample stage 200 and a ground 230. Referring to FIG. 2B, in another embodiment this reference point is set to be at the lower end of the pole piece of objective lens module 130. As a result, an example height 240 of the sample stage 200 is defined as a vertical distance between the top surface of sample stage 200 and the lower end of the pole piece of objective lens module 130. An example working distance is illustrated in FIG. 2C. As shown, the example working distance 250 is defined to be the distance between the lower end of the objective lens module 130 and the surface of sample 210.

Through the above methods, the control module 180 defocuses the charged particle beam probe 140 when scanning a certain area on the surface of sample 210 at certain timing.

Accordingly, in this embodiment the control module 180 is designed to control the condenser lens module 120, the objective lens module 130 and the sample stage 200 to selectively defocus the charged particle beam probe 140 when scanning the sample surface. To carry out this function, the control module 180 can be implemented in various ways, such as an independent IC, an embedded control device, or a computer program encoded in a computer readable medium. The form of the control module 180 does not limit the scope of the present invention, which is to be defined in the claims.

Figure 3A:
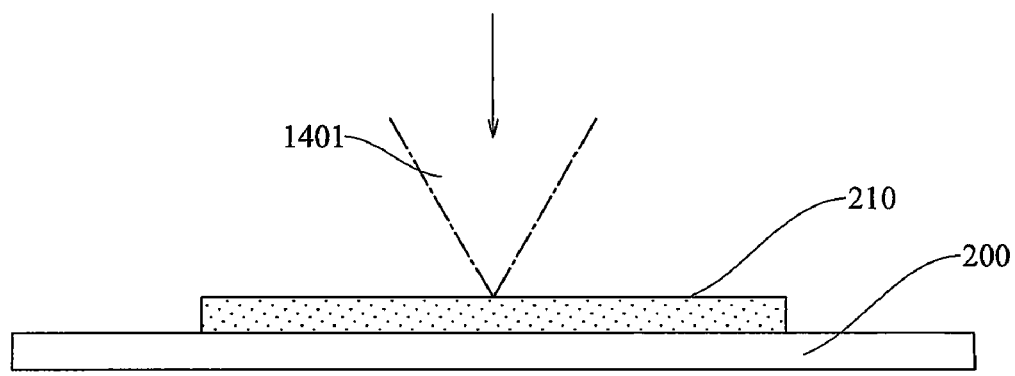
FIG. 3A, FIG. 3B and FIG. 3C are schematic diagrams illustrating the focused and defocused charged particle beam probe in accordance with an embodiment of the present invention.
Figure 3B:
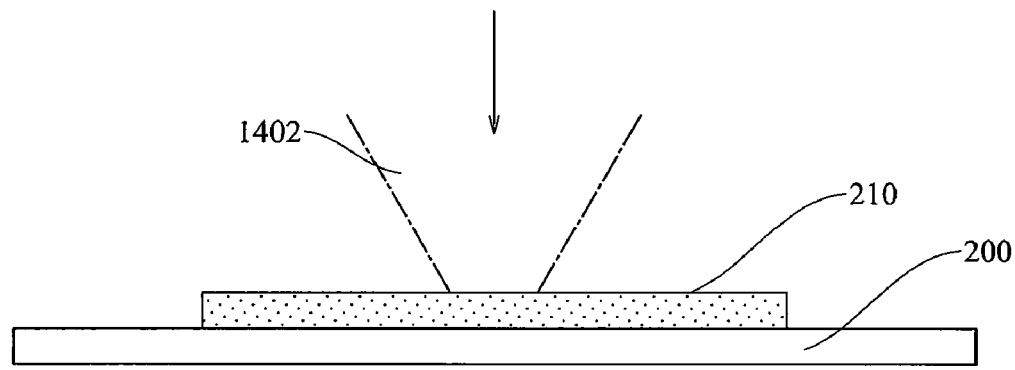
Figure 3C:
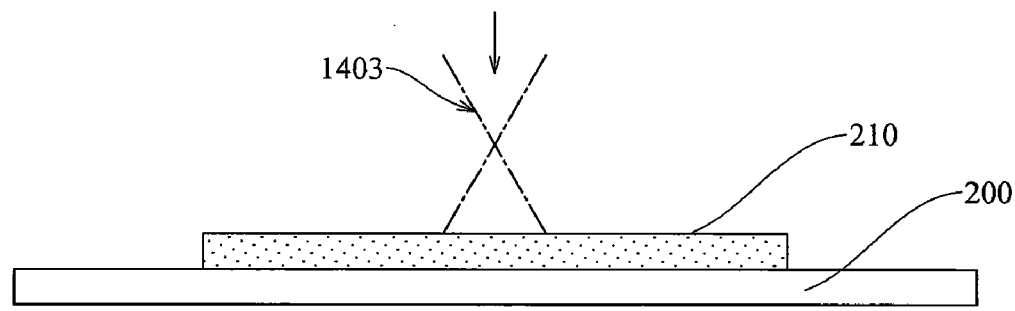

Referring to FIGS. 3A, 3B and 3C, which are illustrations of a focused and defocused charged particle beam probe 140 in accordance with an embodiment of the present invention. By observing the location of its focus point with reference to the surface of the sample 200, the charged particle beam probe 140 may be identified as being focused or defocused. Referring to FIG. 3A, in one example, a beam probe 1401 is identified as being focused with its focus point located on the surface of the sample 210. Referring to FIG. 3B, in another example, a beam probe 1402 is identified as being underfocused with its focus point located spatially behind the surface of sample 210. Referring to FIG. 3C, in yet another example, a beam probe 1403 is identified as being overfocused with its focus point located spatially ahead of the surface of the sample 210.

In one embodiment, the focused scanning operation and the defocused scanning operation are alternately performed. For example, in the pre-scan operation, firstly the charged particle beam probe 140 is defocused when scanning the surface of sample 210 in at least one scan line so as to regulate the sample surface charging (which will be called a regulating scan hereinafter). The regulating scan may be performed to charge the sample surface to a certain charging condition, or to remove the previously existing sample surface charging. Then, the charged particle beam probe 140 is focused when scanning the surface of sample 210 in at least one scan line so as to sample the sample 210 and generate an image of the sample 210 accordingly (which will be called a sampling scan hereinafter). In other words, in the pre-scan mode operation, the regulating scan precedes the sampling scan.

On the other hand, in the post-scan mode operation, firstly the charged particle beam probe 140 is focused when scanning sample 210 in at least one scan line to generate an image of the sample 210. Then, the charged particle beam probe 140 is defocused when scanning sample 210 in at least one scan line to release the surface charging induced by the previous sampling scan. In other words, in the post-scan mode operation the sampling scan precedes the regulating scan.

Figure 4A:
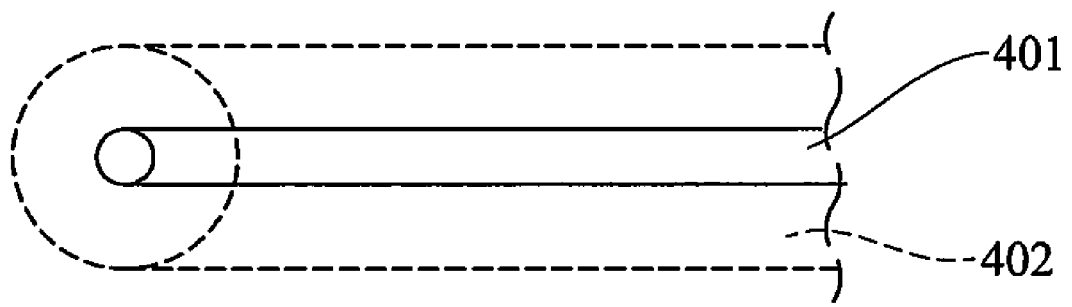
FIG. 4A and FIG. 4B are schematic diagrams illustrating the geographical relation of an imaging and regulating scan line in accordance with an embodiment of this invention.
Figure 4B:
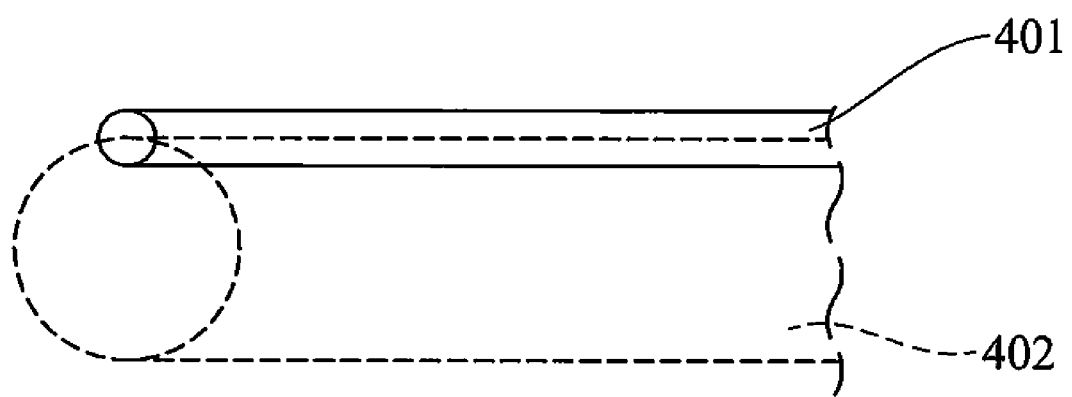

In one embodiment, regardless of the post-scan or pre-scan mode operation, the sampling and regulating scan are alternately performed to avoid the adverse effects of the surface charging. Moreover, in one embodiment, during individual sampling and regulating scans the sample 210 is scanned at the same location and/or the vicinity thereof in at least scan line, as illustrated in FIG. 4A and FIG. 4B. As shown, in the illustrated example a regulating scan line 402 is formed at the same location as an imaging scan line 401 (FIG. 4A). Alternative, the regulating scan line 402 may be formed in the vicinity of the imaging scan line 401 (FIG. 4B). It is noted that in either case shown in FIG. 4A and FIG. 4B, the image scan line 401 is included in the coverage area of the regulating scan line 402. It is also noted that in this example, the geographical relation of the imaging and regulating scan lines 401 and 402 holds regardless of the order in time of the appearance of imaging and regulating lines 401 and 402 i.e. regardless of it being a pre-scan or post-scan mode operation.

As there are more than one method that can be used to defocus the charged particle beam, such as adjusting the driving current and/or voltage of the condensing lens module 120, adjusting the driving current and/or voltage of the objective lens module 130, and/or adjusting the height of the sample stage 200 to alter the distance between the objective lens module 130 and the surface of sample 210, any combination of these methods are also possible for the present invention. Moreover, it is noted that the above adjusting actions, including the details which will be described in the following embodiments, can be implemented as a computer program which is encoded in a computer readable medium and executed by the control module 180.

As mentioned earlier, in the pre-scan mode operation the regulating scan precedes the sampling scan, and in the post-scan mode operation the sampling scan precedes the regulating scan. In either mode, the individual sampling and regulating charged particle beam probe induces a corresponding charging condition on the sample surface. For convenience, these two surface charging conditions will respectively be referred to as a first charging condition and a second charging condition according to the order in time of their appearance. In other words, a first scanning charged particle beam probe, be it sampling or regulating beam probe, induces a first charging condition on the sample surface, and then a second scanning charged particle beam probe, be it regulating or sampling beam probe, induces a second charging condition on the sample surface.

As a result, in one embodiment a generalized imaging method of a sample using a charged particle beam may be disclosed, which includes a combination of the pre-scan and post-scan mode operations and comprises: scanning a surface of a sample in at least one first scan line using a first charged particle beam probe; scanning the sample surface in at least one second scan line using a second charged particle beam probe; and scanning the sample surface in at least one third scan line using the first charged particle beam probe, wherein one of the first and second charged particle beam probe is selectively defocused when scanning the sample surface. The first charged particle beam probe induces a first charging condition on the sample surface being scanned, and the second charged particle beam probe induces a second charging condition on the sample surface being scanned. In this embodiment, the defocused beam probe is used to regulate the surface charging, and the focused beam probe is used for sampling the sample. In addition, after one of the first and second beam probes has been selected to be defocused, the other one is set to be focused when scanning the surface of the sample.

It is noted that in this embodiment, the third scan lines are named so because of their later appearance in time. In one embodiment, they are substantially equal to the first scan lines. For example, if the first charged particle beam probe is focused for sampling the sample, then both the first and third scan lines are imaging scan lines. Similarly, if the second charged particle beam probe is focused for sampling the sample, then the second scan lines are imaging scan lines.

Further, as the defocused and thus the focused charged particle beam probe is selected from the first and second charged particle beam probes, an image of the sample is therefore selectively obtained from the first, second and third scan lines formed by these two beam probes. For example, if the second charged particle beam probe is defocused, then the image of the sample is obtained from the first and third scan lines formed by the focused first charged particle beam probe, and if the first charged particle beam probe is defocused, then the image is obtained from the second scan lines formed by the focused second charged particle beam probe.

Here, the charging condition refers to the sign and quantity of an accumulated electric charge induced by the scanning charged particle beam probe, focused or defocused. The interaction between the first and second charging condition on the sample surface essentially depends on the electric charge polarity carried by individual charging conditions. For example, if the first and second charging conditions carry the same electric charge polarity, then the second charging condition could, in terms of the quantity and sign of the electric charge, enhance, mitigate or have no effect on the first charging condition. On the contrary, if the first and second charging conditions carry a different electric charge polarity, for example a positive vs. negative electric charge polarity, a positive/negative vs. neutral electric charge polarity, etc., then the second charging condition could, in terms of the quantity and sign of the electric charge, mitigate, neutralize or reverse the first charging condition.

For example, in the post-scan mode operation, the second charging condition is produced to regulate the first charging condition. After the effect of the second charging condition has been delivered to the first charging condition, a net charging condition will result on the sample surface. The quality of a next image to be formed by the focused charged particle beam probe (which is the first charged particle beam probe in this case) will be improved due to the existence of this net charging condition on the sample surface. In one embodiment, the second charging condition is substantially equal to the net charging condition. A number of example situations are listed in Table 1 for better illustration of the regulation of the first charging condition by using the second charging condition in a post-scan mode operation.

For example, when sampling the sample, a focused first charged particle beam probe induces a first charging condition of accumulated positive charges of 5 volts on the sample surface, and then a defocused second charged particle beam probe is scanned across the sample surface to regulate the generated first charging condition by introducing a second charging condition to the sample surface which interacts with the first charging condition, resulting a net charging condition on the sample surface. Assuming the second charging condition has the same electric charge polarity as the first charging condition, then if the net charging condition is higher than 5 volts, such as 10 volts, the second charging condition is deemed to have enhanced the first charging condition; if the net charging condition is still measured to be 5 volts, the second charging condition is deemed to have had no effect on the first charging condition; if the net charging condition is lower than 5 volts, such as 2 volts, the second charging condition is deemed to have mitigated the first charging condition. On the other hand, for the case that the second charging condition has an electric charge polarity different than the first charging condition, if the net charging condition still has the same electric charge polarity as the first charging condition but less in quantity, such as 2 volts, the first charging condition is deemed to have been mitigated by the second charging condition; if the net charging condition is measured to be 0 voltage, the first charging condition is deemed to have been eliminated (neutralized) by the second charging condition; if the net charging condition has an opposite electric charge polarity to the first charging condition, such as −2 volts, the first charging condition is deemed to have been reversed by the second charging condition.

In summary, the second charging condition may have the same electric charge polarity as the first charging condition, or the second charging condition may have an electric charge polarity different than that of the first charging condition. When both charging conditions have the same electric charge polarity, the second charging condition may enhance, mitigate or have no effect on the first charging condition. When the two charging conditions have a different electric charge polarity, the second charging condition may mitigate, eliminate (neutralize) or reverse the first charging condition.

It is noted that although a specific scenario of a post-scan mode operation with a positive first charging condition has been given here as an example, similar rationing can be applied to other scenarios as well, such as a pre-scan mode operation with a positive first charging condition, a post-scan mode operation with a negative first charging condition, a pre-scan mode operation with a negative first charging condition, a post-scan mode operation with a neutral first charging condition, a pre-scan mode operation with a neutral first charging condition, etc.

TABLE 1

| $1^{st}$ charging condition | voltage of the $1^{st}$ charging condition (Vi) (volt) | $2^{nd}$ charging condition | net charging condition (In comparison to $1^{st}$ charging condition) | voltage of net charging condition (Vn) (volt) | Effect of $2^{nd}$ charging condition on $1^{st}$ charging condition |
|---|---|---|---|---|---|
| positive | $V_i$ (>0) | positive | more positive | $V_n > V_i$ | Enhancing |
| positive | $V_i$ | positive | unchanged | $V_n = V_i$ | no effect |
| positive | $V_i$ | positive | less positive | $V_n < V_i$ | Mitigating |
| positive | $V_i$ | negative | less positive | $V_n < V_i$ | Mitigating |
| positive | $V_i$ | negative | neutral | $V_n = 0$ | eliminating (neutralizing) |
| positive | $V_i$ | negative | negative | $V_n < 0$ | Reversing |

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for regulating surface charging on a sample during charged particle beam imaging, comprising:
   scanning a surface of said sample in at least one first scan line using a first charged particle beam probe, said first charged particle beam probe inducing a first charging condition on said sample surface being scanned;
   scanning said sample surface in at least one second scan line using a second charged particle beam probe, said second charged particle beam probe inducing a second charging condition on said sample surface being scanned; and
   scanning said sample surface in at least one third scan line using said first charged particle beam probe, wherein one of said first and second charged particle beam probe is selectively defocused when scanning said sample surface.

2. The method of claim 1, wherein when one of said first and second charged particle beam probe is defocused, the other one is focused when scanning said sample surface.

3. The method of claim 1, wherein said second charging condition has the same electric charge polarity as said first charging condition, such that the introduction of said second charging condition to said sample surface enhances, mitigates or has no effect on existing said first charging condition.

4. The method of claim 1, wherein said second charging condition has a different electric charge polarity than that of said first charging condition, such that the introduction of said second charging condition to said sample surface mitigates, eliminates or reverses existing said first charging condition.

5. The method of claim 1, wherein an image of said sample is selectively obtained from said first, second or third scan lines.

6. The method of claim 2, wherein
   when said second charged particle beam probe is defocused, an image of said sample is obtained from said first and third scan lines formed by focused said first charged particle beam probe, and
   when said first charged particle beam probe is defocused, said image is obtained from said second scan lines formed by focused said second charged particle beam probe.

7. A charged particle beam imaging system capable of regulating sample surface charging during charged particle beam imaging, comprising:
   a charged particle beam source, said charged particle beam source generating a primary charged particle beam;
   a condenser lens module for condensing generated said primary charged particle beam;
   an objective lens module for focusing condensed said primary charged particle beam into a charged particle beam probe;
   a deflection module for scanning said charged particle beam probe across a surface of a sample so as to form an image of said sample;
   a sample stage for holding said sample thereon, said sample stage being able to move multi-dimensionally; and
   a control module coupled to said deflection module, said condenser lens module, said objective lens module and said sample stage, wherein said control module selectively defocuses said charged particle beam probe when scanning said sample surface thereby forming a first charged particle beam probe and a second charged particle beam probe, with one of said first and second charged particle beam probes being defocused.

8. The charged particle beam imaging system of claim 7, wherein defocusing of said charged particle beam probe is achieved by said control module through adjusting a driving current and/or voltage of said condenser lens module.

9. The charged particle beam imaging system of claim 7, wherein defocusing of said charged particle beam probe is achieved by said control module through adjusting the strength of an electrostatic field and/or a magnetic field generated by said condenser lens module for controlling the convergence of said primary charged particle beam.

10. The charged particle beam imaging system of claim 7, wherein defocusing said charged particle beam probe is achieved in one of the following fashions:
    when a driving current and/or voltage of said condenser lens module is adjusted to increase, an electrostatic and/or magnetic field generated by said condenser lens module increases, shifting a focus point of said charged particle beam probe towards said objective lens module; and
    when a driving current and/or voltage of said condenser lens module is adjusted to decrease, said electrostatic and/or magnetic field generated by said condenser lens module decreases, shifting said focus point of said charged particle beam probe away from said objective lens module.

11. The charged particle beam imaging system of claim 7, wherein defocusing of said charged particle beam probe is achieved by said control module through adjusting a driving current and/or voltage of said objective lens module.

12. The charged particle beam imaging system of claim 7, wherein defocusing of said charged particle beam probe is achieved by said control module through adjusting the strength of an electrostatic field and/or a magnetic field generated by said objective lens module for controlling the convergence of said charged particle beam probe.

13. The charged particle beam imaging system of claim 7, wherein defocusing said charged particle beam probe is achieved in one of the following fashions:
    when a driving current and/or voltage of said objective lens module is adjusted to increase, an electrostatic and/or magnetic field generated by said objective lens module increases, shifting a focus point of said charged particle beam probe towards said objective lens module; and
    when a driving current and/or voltage of said objective lens module is adjusted to decrease, said electrostatic and/or magnetic field generated by said objective lens module decreases, shifting said focus point of said charged particle beam probe away from said objective lens module.

14. The charged particle beam imaging system of claim 7, wherein defocusing of said charged particle beam probe is achieved by said control module through adjusting the height of said sample stage to alter the relative distance between said objective lens module and said sample surface.

15. The charged particle beam imaging system of claim 8, wherein said height of said sample stage is a distance of the surface of said sample stage to said objective lens module.

16. The charged particle beam imaging system of claim 7, wherein said control module comprises a computer readable medium encoded with a computer program, said program executing actions comprising:
    scanning said sample in at least one first scan line using said first charged particle beam probe;
    scanning said sample in at least one second scan line using said second charged particle beam probe; and scanning said sample in at least one third scan line using said first charged particle beam probe.

17. The charged particle beam imaging system of claim 16, wherein said image of said sample is selectively obtained from said first, second or third scan lines.

18. The charged particle beam imaging system of claim 16, wherein when one of said first and second charged particle beam probe is defocused, the other one is focused when scanning said sample surface.

19. The charged particle beam imaging system of claim 18, wherein
when said second charged particle beam probe is defocused, said image of said sample is obtained from said first and third scan lines formed by focused said first charged particle beam probe, and
when said first charged particle beam probe is defocused, said image is obtained from said second scan lines formed by focused said second charged particle beam probe.

20. The charged particle beam imaging system of claim 7, wherein said first and second charged particle beam probe induce a first and second charging condition on said sample surface being scanned, respectively,
wherein said second charging condition has the same electric charge polarity as said first charging condition, such that the introduction of said second charging condition to said sample surface enhances, mitigates or has no effect on existing said first charging condition.

21. The charged particle beam imaging system of claim 20, wherein said second charging condition has a different electric charge polarity than that of said first charging condition, such that the introduction of said second charging condition to said sample surface mitigates, eliminates or reverses existing said first charging condition.

22. The charged particle beam imaging system of claim 7, wherein said control module is coupled to said deflection module, said condenser lens module, said objective lens module and said sample stage through a medium selected from the group consisting of the following, or any combination thereof: cable wire, optical fiber cable, portable storage media, IR, Bluetooth, intranet, internet, wireless network, wireless radio.

23. The charged particle beam imaging system of claim 18, wherein the beam spot diameter of said defocused beam probe is equal to or greater than 1.5 times that of said focused beam probe.

* * * * *